US012782452B2

(12) United States Patent
Schmidt et al.

(10) Patent No.: US 12,782,452 B2
(45) Date of Patent: Nov. 3, 2026

(54) CAPACITANCE MEASUREMENT SYSTEM FOR BATTERY CELL

(71) Applicant: GM GLOBAL TECHNOLOGY OPERATIONS LLC, Detroit, MI (US)

(72) Inventors: Robert D. Schmidt, Bloomfield Hills, MI (US); Nicholas Paul William Pieczonka, Windsor (CA); James R. Salvador, East Lansing, MI (US); Raneen Taha, Sterling Heights, MI (US); Brian Kim, Sterling Heights, MI (US); Ratandeep Singh Kukreja, Auburn Hills, MI (US); Erik Damon Huemiller, Troy, MI (US); Shaomao Xu, Sterling Heights, MI (US); Ryan Curtis Sekol, Grosse Pointe Woods, MI (US); Michael P. Balogh, Novi, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 182 days.

(21) Appl. No.: 18/791,506

(22) Filed: Aug. 1, 2024

(65) Prior Publication Data

US 2026/0036639 A1 Feb. 5, 2026

(51) Int. Cl.

*G01R 31/389* (2019.01)
*G01R 31/382* (2019.01)
(Continued)

(52) U.S. Cl.

CPC ......... *G01R 31/389* (2019.01); *G01R 31/382* (2019.01); *G01R 31/3865* (2019.01); *H01M 10/058* (2013.01)

(58) Field of Classification Search

CPC ........ G01R 27/00; G01R 27/02; G01R 27/26; G01R 31/00; G01R 31/36; G01R 31/382;
(Continued)

(56) References Cited

U.S. PATENT DOCUMENTS

| | | | | |
|---|---|---|---|---|
| 6,215,311 B1 * | 4/2001 | Miyamoto | ............ | H01M 10/48 324/432 |
| 12,040,461 B2 | 7/2024 | Huemiller et al. | | |
| 2023/0198034 A1 | 6/2023 | Huemiller et al. | | |

FOREIGN PATENT DOCUMENTS

| | | | | |
|---|---|---|---|---|
| JP | H06333606 A * | 12/1994 | ........... | G01R 31/379 |
| WO | WO-2026000244 A1 * | 1/2026 | ............ | H01M 10/48 |

OTHER PUBLICATIONS

"Ceramic Capacitor Aging Made Simple", Johanson Dielectrics Inc., May 21, 2012 (Year: 2012).*

(Continued)

*Primary Examiner* — Hoai-An D. Nguyen

(74) *Attorney, Agent, or Firm* — CANTOR COLBURN LLP

(57) ABSTRACT

Aspects of the disclosure include a system for monitoring a capacitance across a battery cell during electrolyte wetting and cell formation and methods of using the same. An exemplary system includes a battery cell, a first conductive plate positioned over a first end of the battery cell, and a second conductive plate positioned on a second end of the battery cell. The first conductive plate is separated from the first end of the battery cell by a gap and the second conductive plate includes a component of the battery cell. The second end of the battery cell is opposite the first end of the battery cell. The system includes a capacitance measurement system electrically coupled to the first conductive plate and the second conductive plate. The capacitance measure- (Continued)

ment system is configured to measure a capacitance across the first conductive plate and the second conductive plate.

16 Claims, 7 Drawing Sheets

(51) Int. Cl.
*G01R 31/385* (2019.01)
*H01M 10/058* (2010.01)

(58) Field of Classification Search
CPC .............. G01R 31/385; G01R 31/3865; G01R 27/2605; G01R 31/389; H01M 10/00; H01M 10/05; H01M 10/058; H01M 10/42; H01M 2220/00; H01M 10/48; H01M 2220/20; Y02E 60/00; Y02E 60/10; G01D 5/00; G01D 5/12; G01D 5/14; G01D 5/24; G01N 27/00; G01N 27/02; G01N 27/22; G01N 27/26
USPC .................................................. 324/425, 426
See application file for complete search history.

(56) References Cited

OTHER PUBLICATIONS

German Office Action for German Application No. 102024127511.1; dated Apr. 7, 2025; 5 pages.

* cited by examiner

CAPACITANCE MEASUREMENT SYSTEM FOR BATTERY CELL

INTRODUCTION

The present disclosure relates to battery cell manufacturing, and particularly to the use of a capacitance measurement system and a method of using the same for monitoring a capacitance across a battery cell during electrolyte wetting and cell formation.

High voltage electrical systems are increasingly used to power the onboard functions of both mobile and stationary systems. For example, in motor vehicles, the demand to increase fuel economy and reduce emissions has led to the development of advanced electric vehicles (EVs). EVs rely upon Rechargeable Energy Storage Systems (RESS), which typically include one or more high voltage battery packs, and an electric drivetrain to deliver power from the battery to the wheels. Battery packs can include any number of interconnected battery modules depending on the power needs of a given application. Each battery module includes a collection of conductively coupled electrochemical cells. The battery pack is configured to provide a Direct Current (DC) output voltage at a level suitable for powering a coupled electrical and/or mechanical load (e.g., an electric motor).

The lithium-ion battery (LIB) has become one of the most common battery chemistries for these and other applications. A typical lithium-ion battery consists of three main components: an anode, often made of graphite, a cathode, often made of lithium cobalt oxide ($LiCoO_2$), lithium manganese oxide ($LiMn_2O_4$), or lithium iron phosphate ($LiFePO_4$), and a liquid electrolyte, commonly a lithium salt dissolved in a solvent, such as ethylene carbonate and dimethyl carbonate, or a solid polymer electrolyte. The electrolyte acts as a medium for lithium ion transport between the anode and cathode during charge and discharge processes. Current collectors provide a conductive pathway for electrons to flow between the electrodes and an external circuit. The current collector for the anode is typically made of copper or a copper alloy, while the current collector for the cathode is typically made of aluminum or an aluminum alloy.

During the discharge process, lithium metal atoms at the anode oxidize and release electrons, which flow through the external circuit to the cathode, providing electrical energy to power a device. At the same time, lithium ions migrate from the anode through the electrolyte and intercalate into the cathode material. During charging, this process is reversed, with lithium ions being extracted from the cathode and deposited back onto the anode as metallic lithium.

SUMMARY

In one exemplary embodiment a system for monitoring a capacitance across a battery cell during electrolyte wetting and cell formation includes a battery cell, a first conductive plate positioned over a first end of the battery cell, and a second conductive plate positioned on a second end of the battery cell. The first conductive plate is separated from the first end of the battery cell by a gap and the second conductive plate includes a component of the battery cell. The gap may be produced by or filled in with a polymer or other nonconductive layer, including using the polymer layer on the casing of the battery cell itself. The second end of the battery cell is opposite the first end of the battery cell. The system includes a capacitance measurement system electrically coupled to the first conductive plate and the second conductive plate. The capacitance measurement system is configured to measure a capacitance across the first conductive plate and the second conductive plate.

In addition to one or more of the features described herein, in some embodiments, the capacitance measurement system is further configured to generate, during an electrolyte wetting process in which a liquid electrolyte is introduced into the battery cell, a capacitance-time curve.

In some embodiments, the capacitance measurement system is further configured to identify, in the capacitance-time curve, a first region dominated by a linearly decreasing capacitance over log time and a second region dominated by a linearly stable capacitance over log time.

In some embodiments, the capacitance measurement system is further configured to identify an improper wetting condition for the battery cell according to an absolute value of a capacitance of the battery cell within the second region.

In some embodiments, the capacitance measurement system is further configured to generate, during a formation cycling process for the battery cell, a capacitance-voltage curve.

In some embodiments, the capacitance measurement system is further configured to identify, in the capacitance-voltage curve, a first formation effect includes an activation of an additive in the battery cell during the formation cycling process.

In some embodiments, identifying the first formation effect includes identifying a destabilization of a capacitance measurement with a first increase in a capacitance-voltage cycling ratio of the battery cell.

In some embodiments, the capacitance measurement system is further configured to identify, in the capacitance-voltage curve, a second formation effect includes the phase changes in the anode and cathode active materials due to intercalation and depletion of lithium ions, respectively (that is, an indication of when SEI formation has been achieved).

In some embodiments, identifying the second formation effect includes identifying a peak and subsequent drop in both a capacitance measurement and a capacitance-voltage cycling ratio of the battery cell.

In some embodiments, the capacitance measurement system is further configured to identify, in the capacitance-voltage curve, a third formation effect includes a completion of the formation cycling process as indicated by completion of several phase transitions in the anode and cathode active materials.

In another exemplary embodiment a method includes providing a battery cell, positioning a first conductive plate over a first end of the battery cell, the first conductive plate separated from the first end of the battery cell by a gap, positioning a second conductive plate on a second end of the battery cell, the second conductive plate including a component of the battery cell, the second end of the battery cell opposite the first end of the battery cell, electrically coupling a capacitance measurement system to the first conductive plate and the second conductive plate, and measuring, with the capacitance measurement system, a capacitance across the first conductive plate and the second conductive plate during at least one of an electrolyte wetting process and a formation cycling process.

In some embodiments, the method includes generating, during an electrolyte wetting process in which a liquid electrolyte is introduced into the battery cell, a capacitance-time curve.

In some embodiments, the method includes identifying, in the capacitance-time curve, a first region dominated by a linearly decreasing capacitance over log time and a second region dominated by a linearly stable capacitance over log time.

In some embodiments, the method includes identifying an improper wetting condition for the battery cell according to an absolute value of a capacitance of the battery cell within the second region.

In some embodiments, the method includes generating, during a formation cycling process for the battery cell, a capacitance-voltage curve.

In some embodiments, the method includes identifying, in the capacitance-voltage curve, a first formation effect includes an activation of an additive in the battery cell during the formation cycling process.

In some embodiments, identifying the first formation effect includes identifying a destabilization of a capacitance measurement with a first increase in a capacitance-voltage cycling ratio of the battery cell.

In some embodiments, the method includes identifying, in the capacitance-voltage curve, a second formation effect includes the phase changes in the anode and cathode active materials due to intercalation and depletion of lithium ions, respectively.

In some embodiments, identifying the second formation effect includes identifying a peak and subsequent drop in both a capacitance measurement and a capacitance-voltage cycling ratio of the battery cell.

In some embodiments, the method includes identifying, in the capacitance-voltage curve, a third formation effect includes a completion of the formation cycling process as indicated by completion of several phase transitions in the anode and cathode active materials.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings.

DETAILED DESCRIPTION

Figure 1:
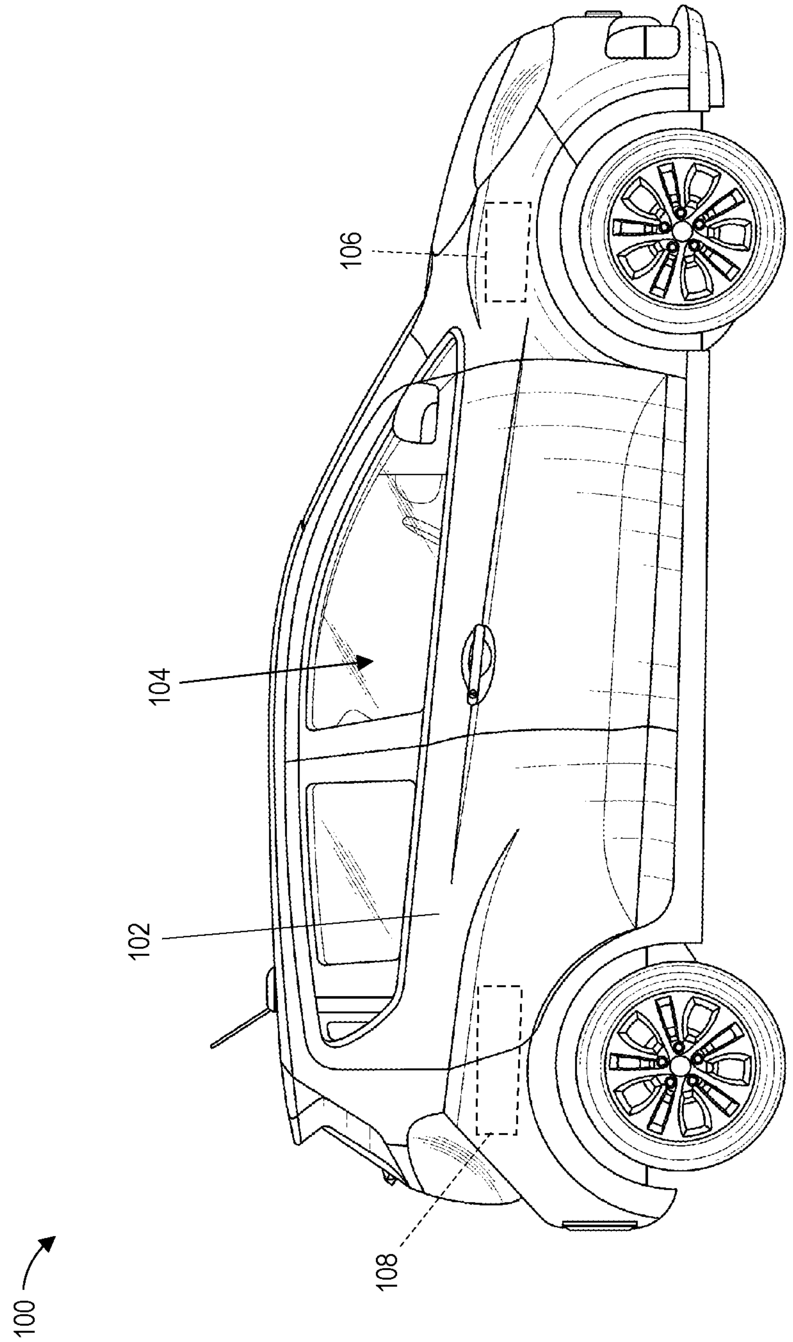
FIG. 1 is a vehicle configured in accordance with one or more embodiments.

The following description is merely exemplary in nature and is not intended to limit the present disclosure, its application or uses. It should be understood that throughout the drawings, corresponding reference numerals indicate like or corresponding parts and features.

As the demand for energy storage systems offering higher energy densities, faster charging, and extended operational lifespans increases, driven in part by the proliferation of electric vehicles, significant challenges have been imposed on the materials used in battery cell components. Research and development efforts are continuously directed toward identifying novel materials and improving manufacturing techniques to meet ever-escalating demands on battery cells and other energy storage systems.

One challenge in current battery manufacturing processes is the inherent delay associated with electrolyte wetting. Electrolyte wetting refers to the process by which a liquid electrolyte is introduced into a battery cell and allowed to thoroughly penetrate and saturate the porous structures of the battery electrodes and separator. Typically occurring after the assembly of electrodes and other cell components, but before formation cycling, the electrolyte wetting process requires precise control over multiple parameters, such as the composition and purity of the electrolyte, the filling speed and pressure, temperature conditions, and the level of vacuum applied during the wetting process. The goal during the electrolyte wetting process is to achieve complete and uniform electrolyte infiltration of the electrode materials, ensuring optimal and homogenous ion conductivity throughout the pouch or cell while avoiding issues such as air pockets or dry spots that could lead to reduced capacity or performance concerns.

Unfortunately, it is difficult to measure the saturation of the electrode materials and separator during the electrolyte wetting process, as current methods used to measure the level of wetting in real-time are slow and/or otherwise limited. Current techniques for monitoring the electrolyte wetting process include, for example, ultrasonic mapping and voltage monitoring.

Ultrasonic mapping typically requires point-by-point scanning of the battery cell or pouch, which is inherently time-consuming, especially for larger cells or high-volume production. Moreover, ultrasonic testing often requires a coupling medium between the transducer and the battery surface that introduces contamination risks into the wetting process. High-resolution ultrasonic imaging systems are somewhat expensive, both in terms of initial investment and ongoing maintenance, and there are interpretation challenges due to the complexity of ultrasonic mapping data. Finally, depending on the battery materials and design of a given application, ultrasonic waves may have difficulty penetrating deeply into the cell, and limited penetration will necessarily fail to capture wetting data in the innermost regions or layers of the battery.

Voltage monitoring is perhaps the most common technique and involves the measurement and monitoring of a cell's voltage following the wetting period. Notably, voltage monitoring typically is applied only after the wetting process is supposedly complete and the battery has entered the formation cycling stage-voltage monitoring does not provide real-time information during the actual wetting process. This is an inherent limitation to voltage monitoring, as the technique doesn't directly measure the wetting state but rather infers it from the cell's electrochemical behavior (that is, a measured voltage profile post-wetting). Voltage monitoring typically provides a global measurement for the entire cell, lacking the ability to identify specific areas of poor wetting within the battery structure (e.g., limited spatial resolution). In addition, the voltage behavior during formation is influenced by various factors beyond just wetting, such as solid electrolyte interphase (SEI) formation, the initial lithiation/delithiation of active materials, and other electrochemical processes. This makes it challenging to isolate the effects of incomplete wetting from other phenomena. Finally, as noted, voltage monitoring typically only is applied after the wetting process, meaning that, by the time voltage monitoring that begins during formation indicates a wetting problem, the cell has already progressed far into the manufacturing process, potentially leading to wasted resources if the cell needs to be scrapped.

Due to these limitations, manufacturers often choose to rely instead on long wetting periods, often lasting several hours or even days, to essentially guarantee complete electrolyte wetting. This approach, while effective, has its own limitations: namely, that the wetting period is arbitrarily increased to provide sufficient wetting margin to ensure that sufficient electrolyte wetting has occurred. In other words, manufacturers wait longer than they would otherwise need to in an attempt to guarantee complete wetting. This delay increases the overall manufacturing time of each battery, placing a practical limit on production.

This disclosure introduces the use of a capacitance measurement system and a method of using the same for monitoring a capacitance across a battery cell during electrolyte wetting and cell formation processes. Rather than relying on ultrasonic mapping and/or voltage monitoring to infer the electrolyte wetting condition, battery cells manufactured as described herein are modified and/or otherwise coupled to a capacitance measurement system so that a capacitance across the respective cells can be monitored throughout the wetting process. Without wishing to be bound by theory, it has been found that a transition in the rate of change in the measured capacitance occurs when wetting is complete. Thus, in some embodiments, capacitance across the respective cell(s) is measured during the wetting process until the transition period is identified. Once the transition period has been identified, the battery cell can conclude the wetting process and proceed to formation cycling. In some embodiments, capacitance monitoring continues into the first formation cycle, as it has been further found that formation effects can be detected in this manner independent of lithiation.

Leveraging a capacitance measurement system to monitor the progress of electrolyte filling and wetting and cell formation directly in real-time directly addresses a number of known limitations in prior techniques. In particular, the techniques described herein can be used to eliminate the excessively long wetting periods associated with conventional processes—a battery cell can progress to formation cycling as soon as the transition period has been identified. This can result in a practical reduction in wetting times of more than 70 percent (e.g., from 24 or even 36 hours to as little as 4 hours for some battery chemistries). Advantageously, the capacitance measurement system described herein can be applied to any battery cell or pouch with no or only minimal changes to the underlying cells or pouches (e.g., processes described herein can include the addition of a foil as a capacitor plate to existing fixture designs).

A vehicle, in accordance with an exemplary embodiment, is indicated generally at 100 in FIG. 1. Vehicle 100 is shown in the form of an automobile having a body 102. Body 102 includes a passenger compartment 104 within which are arranged a steering wheel, front seats, and rear passenger seats (not separately indicated). Within the body 102 are arranged a number of components, including, for example, an electric motor 106 (shown by projection under the front hood). The electric motor 106 is shown for ease of illustration and discussion only. It should be understood that the configuration, location, size, arrangement, etc., of the electric motor 106 is not meant to be particularly limited, and all such configurations (including multi-motor configurations) are within the contemplated scope of this disclosure.

The electric motor 106 is powered via a battery pack 108 (shown by projection near the rear of the vehicle 100). The battery pack 108 is shown for ease of illustration and discussion only. It should be understood that the configuration, location, size, arrangement, etc., of the battery pack 108 is not meant to be particularly limited, and all such configurations (including split configurations) are within the contemplated scope of this disclosure. Moreover, while the present disclosure is discussed primarily in the context of a battery pack 108 configured for the electric motor 106 of the vehicle 100, aspects described herein can be similarly incorporated within any system (vehicle, building, or otherwise) having an energy storage system(s) (e.g., one or more battery packs or modules), and all such configurations and applications are within the contemplated scope of this disclosure.

As will be detailed herein, the battery pack 108 includes one or more battery modules, battery cells, and/or battery pouches (collectively, a "battery cell") having an anode, a cathode, and an electrolyte for ion transport between the anode and the cathode. In some embodiments, a battery cell is coupled to a capacitance measurement system configured to monitor a capacitance across a battery cell during electrolyte wetting and cell formation processes (refer to FIG. 3). Capacitance across the battery cell can be monitored during electrolyte wetting to identify an electrolyte wetting condition (refer to FIG. 4). Capacitance across the battery cell can be monitored during a first formation cycle to identify a cycling condition (refer to FIG. 5).

Figure 2B:
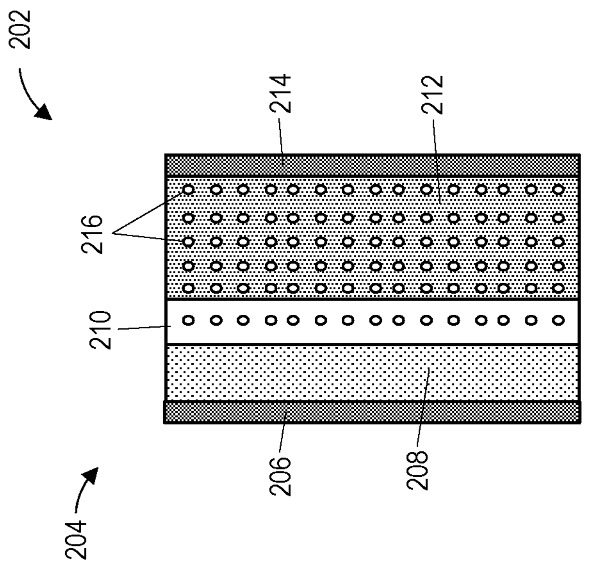
FIG. 2B is a detailed view of the battery cell shown in FIG. 2A in accordance with one or more embodiments.
Figure 2A:
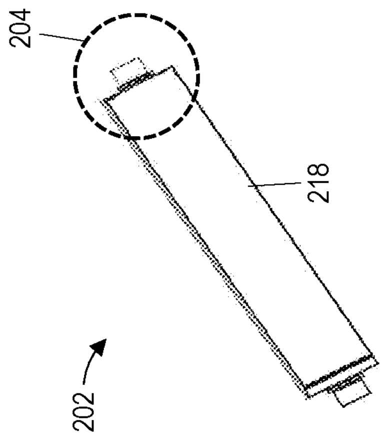
FIG. 2A is an example battery cell in accordance with one or more embodiments.

FIG. 2A illustrates an example battery cell 202 in accordance with one or more embodiments. The battery cell 202 can be incorporated as one of a number of battery cells in a battery pack (e.g., the battery pack 108 in FIG. 1). FIG. 2B illustrates a detailed view 204 of the battery cell 202 shown in FIG. 2A in accordance with one or more embodiments. As shown in FIG. 2B, the battery cell 202 includes, from left to right, an anode current collector 206, an anode active material layer 208, a separator 210, a cathode active material layer 212, and a cathode current collector 214, configured and arranged as shown.

The anode current collector 206 and the cathode current collector 214 can be made of sheets, foils (continuous or with punches or cuts), or mesh of conductive materials. For example, the cathode current collector 214 can be made of aluminum foil, stainless steel, and/or titanium foil. Other materials are possible, such as, for example, semimetals (e.g., tin, graphite) and alloys of the metals and/or semimetals thereof. In some embodiments, the cathode current collector 214 is made of aluminum foil. The anode current collector 206 can include, for example, copper foil and/or one or more graphene layers. In some embodiments, the anode current collector 206 is made of copper foil. The thickness of a current collector can be approximately 10 to 20 μm, although other thicknesses are within the contemplated scope of this disclosure.

The anode active material layer 208 and the cathode active material layer 212 can include various anode or cathode active materials, respectively. The anode active material layer 208 is not meant to be particularly limited, and can include, for example, lithium metal, activated carbon powder, graphite, silicon, silicon-graphite composites, tin, tin oxide ($SnO_2$), lithium titanate ($Li_4Ti_5O_{12}$, LTO), and combinations thereof. In some embodiments, the anode active material layer 208 includes lithium metal and at least one of lithium lanthanum zirconate ($Li_7La_3Zr_2O_{12}$, LLZO), lithium phosphorus oxynitride ($Li_3PO_4$, LiPON), lithium super ionic conductor (LISICON), and lithium germanium sulfide ($Li_4GeS_4$, LGS). The cathode active material layer 212 is not meant to be particularly limited, but can include, for example, nickel manganese cobalt oxide (NMC), LFP, nickel cobalt aluminum oxide (NCA), nickel cobalt manganese aluminum oxide (NCMA), lithium manganese iron phosphate (LMFP), lithium manganese rich (LMR), lithium manganese oxide (LMO), and lithium nickel manganese oxide (LNMO).

In some embodiments, such as for sodium ion battery (SIB) applications, the cathode or anode active materials can include SIB active materials, such as layered- and tunnel-structured transition metal oxides, polyanion compounds, and prussian blue analogs (PBAs), hard carbon materials, such as petroleum coke or mesocarbon microbeads (MCMB), graphite, sodium titanates, such as $Na_2Ti_3O_7$ and $Na_{0.44}MnO_2$, tin-based compounds, such as $SnO_2$ and $SnS_2$, phosphorus-based compounds, such as phosphorus-carbon composites or phosphorus-based alloys, and combinations thereof.

Depending on battery construction (e.g., conventional vs. bi-polar current collectors, etc.) the separator 210 is optional but, if included, can be positioned to isolate the anode active material layer 208 and the cathode active material layer 212. The separator 210 can include dielectric materials such as, for example, polyethylene (PE), polypropylene (PP), polyethylene terephthalate (PET), and composites thereof, although other dielectrics are within the contemplated scope of this disclosure. In some embodiments, the separator 210 may include a thermally stable coating layer to improve shrinkage behavior (e.g., a porous ceramic coating or porous ester type polymer coating including, for example, polyimide, polyamide, polyimide-polyamide (PI/PA) copolymer, etc.). The thickness of a separator can be approximately 12 to 16 μm, although other thicknesses are within the contemplated scope of this disclosure.

As further shown in FIG. 2B, the battery cell 202 includes an electrolyte 216. In some embodiments, the electrolyte 216 is a liquid electrolyte that permeates, covers, and/or penetrates the cathode active material layer 212. In some embodiments, liquid electrolyte partially penetrates the separator 210 (as shown). In some embodiments, electrolyte 216 includes a lithium salt dissolved in a solvent, although other liquid electrolytes are possible and all such configurations are within the contemplated scope of this disclosure.

The concentration of the lithium salt(s) in the electrolyte 216 will vary depending on the lithium salt(s) chosen and the needs of a given application. The lithium salt concentration can be varied, for example, to target a predetermined ionic conductivity (increasing the salt concentration leads to an increase in ionic conductivity up to a certain point, beyond which the conductivity may decrease due to increased ion-ion interactions and viscosity), to provide suitable levels of salt dissociation and ion mobility (for a given lithium salt, there is a minimum threshold concentration, below which the salt may not fully dissociate, leading to a lack of charge carriers; conversely, there is a maximum threshold concentration, beyond which the increased ion-ion interactions hinder ion mobility sufficiently to reduce conductivity), to provide a target electrolyte viscosity, to target a predetermined electrochemical stability window, and/or to influence the formation and composition of the SEI layer on the lithium metal anode. In some embodiments, the lithium salts can be formed to a concentration of 0.1 M to 2 M, for example, 0.8 M, although other concentrations are within the contemplated scope of this disclosure.

Figure 3:
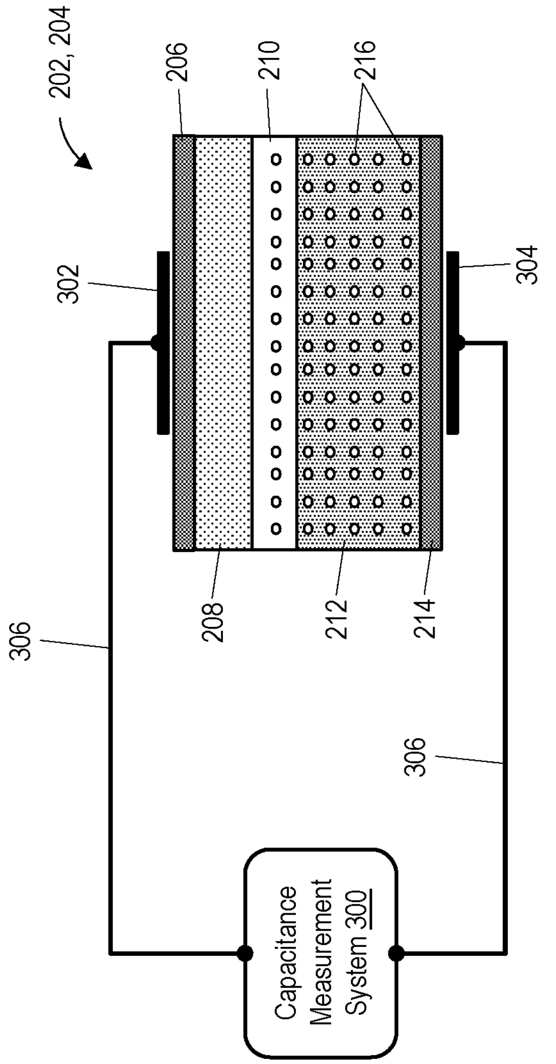
FIG. 3 is an example capacitance measurement system configured to monitor a capacitance across a battery cell during electrolyte wetting and cell formation processes in accordance with one or more embodiments.

FIG. 3 illustrates an example capacitance measurement system 300 configured to monitor a capacitance across a battery cell (e.g., the battery cell 202 of FIGS. 2A and 2B) during electrolyte wetting and cell formation processes in accordance with one or more embodiments. As shown in FIG. 3, the battery cell 202 has been placed between conductive plates 302 and 304. Leads 306 run from the conductive plates 302 and 304 to the capacitance measurement system 300.

While shown as separate elements, in some embodiments, the battery cell 202 itself and/or a component of the battery cell 202 (e.g., a positive or negative terminal, a current collector, etc.) can serve as one of the conductive plates 302 and 304. For example, a housing 218 of a battery cell or battery pouch (refer to FIG. 2A) can serve as one of the conductive plates 302 and 304. In this type of configuration, the housing 218 (or other component) can be electrically coupled directly to the capacitance measurement system 300 via leads 306. Observe, however, that battery cell 202 can only serve as one of the conductive plates 302 and 304, as the battery internals (anode current collector 206, cathode current collector 214, etc.) are electrically coupled via the electrolyte 216, and therefore capacitance measurements are not possible in that configuration (capacitance would measure zero).

Figure 4:
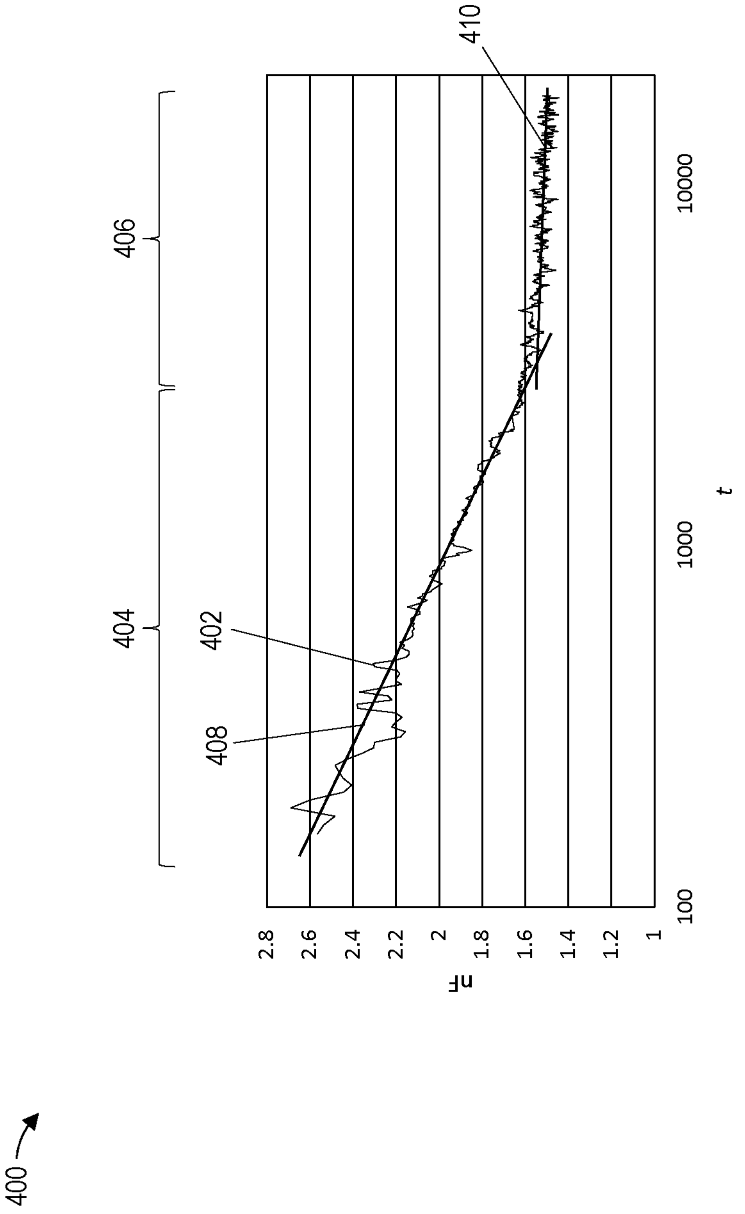
FIG. 4 is an example capacitance-time curve over the course of an electrolyte wetting process in accordance with one or more embodiments.

The capacitance measurement system 300 is not meant to be particularly limited, but can include, for example, a capacitance measuring circuit, an inductance-capacitance-resistance (LCR) monitoring device, a potentiostat, or other equipment capable of applying an AC voltage to a device-under-test (here, the battery cell 202) at a desired frequency and to take corresponding capacitance measurements (refer to FIG. 4). In some embodiments, an AC voltage is passed through the battery cell 202, for example, an AC voltage of between 0.005V and 10V at a corresponding frequency of between 10 Hz and 10,000 Hz. Observe that the charges built up in a capacitor have different time constants, and therefore the choice of frequency or frequencies to monitor a device-under-test are dependent on the underlying system and material configuration of a given application and will necessarily vary as needed. Moreover, due to the capacitor being electrically isolated from the cell (e.g., battery cell 202), there is not a strong dependence on the chosen excitation voltage, however the voltage should be chosen for sufficient signal versus noise, while also being low enough to be below dielectric breakdown and to conserve power. In some embodiments, the capacitance measurement system 300 periodically and/or continuously measures and records a capacitance across the conductive plates 302 and 304. The measured capacitance C for parallel plates (as in the configuration of FIG. 3) can be determined according to the following equation (1):

$$C=\varepsilon_0 * K_{eff} * A/d \quad (1)$$

where $\varepsilon_0$ is the electric constant (also referred to as vacuum permittivity), $K_{eff}$ is the effective dielectric constant, A is area of the conductive plates 302 and 304, and d is distance between the conductive plates 302 and 304.

Observe that $\varepsilon_0$, A, and d are fixed in the configuration shown in FIG. 3. Thus, any changes in the measured capacitance C will be the result of changes in the effective dielectric constant $K_{eff}$, which, in this configuration, is the effective dielectric constant of the battery cell 202 (in short, the battery cell 202 serves as the dielectric medium between the conductive plates 302 and 304). Moreover, these changes in the effective dielectric constant $K_{eff}$ are the result of physical changes within the battery cell 202 (e.g., during the wetting process, during formation cycling, etc.). In particular, during the wetting process air within the battery cell 202 is displaced by the electrolyte 216. This displacement causes a change in the effective dielectric constant $K_{eff}$ of the overall battery cell 202 and a corresponding change in the measured capacitance C, as air and electrolyte 216 do not have the same dielectric constant (electrolyte 216 contributes to the overall effective dielectric constant $K_{eff}$ of the battery cell 202). Therefore, and without wishing to be bound by theory, it has been found that monitoring the measured capacitance C throughout the wetting process allows for a direct measurement of the wetting progression when the battery cell 202 is placed in the configuration shown in FIG. 3. In some embodiments, multiple measurements of the measured capacitance C are taken throughout the wetting process to generate a capacitance-time curve.

FIG. 4 illustrates an example capacitance-time curve 400 over the course of an electrolyte wetting process in accordance with one or more embodiments. As shown in FIG. 4, a series of capacitance measurements 402 (e.g., the measured capacitance C discussed with respect to FIG. 3) have been taken with respect to log time (t). In some embodiments, t=0 refers to the start of an electrolyte wetting process for a battery cell (e.g., the battery cell 202). The capacitance measurements 402 can be taken continuously (as shown) or periodically (not separately indicated) as desired for a given application.

The capacitance-time curve 400 shown in FIG. 4 depicts the electrolyte wetting of a 1 Ah battery cell at 1 KHz. It should be understood, however, that the capacitance-time curve 400 is merely illustrative and that respective curves will vary depending on the underlying battery configuration, size, and chemistry, electrolyte selection, etc., and all such configurations are within the contemplated scope of this disclosure. Moreover, while shown as only a single capacitance-time curve 400 taken at a single frequency (here, 1 kHz), in some embodiments, multiple capacitance-time curves 400 can be similarly generated across a range of frequencies (e.g., 100 Hz, 1000 Hz, etc.) as desired, and all such configurations are within the contemplated scope of this disclosure. Generating multiple capacitance-time curves 400 across two or more frequencies can be beneficial in some embodiments. Observe, for example, that higher frequencies generally have lower noise, but less capacitance changes during wetting. Therefore, frequency choice should balance these factors. Furthermore, different materials may have different frequency dependence, allowing for distinguishing of different subcomponents.

As further shown with respect to FIG. 4, the capacitance-time curve 400 can be divided into at least two regions (e.g., a first region 404 and a second region 406). In some embodiments, the first region 404 is dominated by a linearly decreasing capacitance over log time, as indicated by a first capacitance-time trendline 408. Conversely, in some embodiments, the second region 406 is dominated by a linearly stable capacitance over log time, as indicated by a second capacitance-time trendline 410. As used herein, a "linearly stable" capacitance over log time refers to a capacitance-time trendline having a slope that is zero or below a predetermined threshold (as shown). For example, the second capacitance-time trendline 410 depicts a linearly stable capacitance that is stable between a range of 60 to 66 percent an initial value at the start of the wetting process (here, ~2.6 nF, although the absolute value will be larger, or smaller, for different battery sizes and configurations) from approximately 4000 seconds (~66 minutes) to 15,000 seconds (~4 hours). In some embodiments, the predetermined threshold slope of a linearly stable capacitance-time trendline corresponds to a capacitance that remains within 10%, 5%, 3%, or 1%, of a nominal value throughout the respective period of time. By comparison, the first capacitance-time trendline 408 depicts a linearly decreasing capacitance that drops approximately 40 percent (here, from 2.6 nF to 1.6 nF, although the absolute values will be larger, or smaller, for different battery sizes and configurations) over the course of approximately 3800 seconds (~63 minutes).

The behavior of the first capacitance-time trendline 408 and the second capacitance-time trendline 410 of the first region 404 and second region 406, respectively, is consistent with the diffusion-type behavior of an electrolyte wetting process. That is, the capacitance-time curve 400 has been empirically validated as able to depict the progress and completion (within any desired threshold capacitance stability) of an electrolyte wetting process. For example, the completion of an electrolyte wetting process can be indicated when the capacitance-time curve 400 transitions from the first region 404 to the second region 406.

Advantageously, in some embodiments, a battery cell (e.g., the battery cell 202) undergoing an electrolyte wetting process is not subjected to a predetermined wetting period. Instead, the electrolyte wetting process continues until the respective capacitance-time curve 400 transitions from the first region 404 to the second region 406. In this manner, electrolyte wetting will continue only so long as strictly necessary. Other advantages are possible. For example, the capacitance-time curve 400 can also be used to monitor a battery cell for improper wetting. In particular, the absolute value of the measured capacitance C can indicate improper wetting. Observe, for example, that improper wetting will be evident in the capacitance-time curve 400 when the transition to the second region 406 occurs at a capacitance that is higher than expected (indicating, e.g., that wetting "completed" but the respective battery cell was not able to fully wet). The "expected" final capacitance can be known beforehand (e.g., a design specification), or can be learned by taking capacitance-time curves 400 for a plurality of similar batteries (same configuration, same chemistry, etc.) and documenting the range (and nominal) final capacities achieved. Thus, in some embodiments, a battery cell can be identified as defective and scrapped during the wetting process, and prior to formation cycling, saving additional manufacturing time and resources that would have otherwise been wasted (e.g., there is no need to subject a defective battery cell to formation cycling and other downstream processes).

In some embodiments, the capacitance measurement system 300 (refer to FIG. 3) can be used in monitoring the capacitance of a battery cell (e.g., the battery cell 202) after the electrolyte wetting process completes. In some embodiments, for example, the capacitance measurement system 300 monitors the capacitance of the battery cell during a first formation cycle.

As discussed previously, during the wetting process air within the battery cell 202 is displaced by the electrolyte 216, resulting in a physical change in the cell and a corresponding change in a measured capacitance C of the cell. Similarly, it has been found that capacitance changes during the formation cycling process. In particular, and without wishing to be bound by theory, it has been found that the change in capacitance as a function of the change in cell potential with change in charge capacity (referred to as dQ/dV, or the capacitance-voltage cycling ratio) during the first formation cycle can serve as a physical signature of various formation effects within a battery cell independent of lithiation. Thus, monitoring the measured capacitance C throughout the formation cycling process allows for a direct measurement of the cycling progression when the battery cell 202 is placed in the configuration shown in FIG. 3. In some embodiments, multiple measurements of the measured capacitance C are taken throughout the formation cycling process to generate a capacitance-voltage curve.

Figure 5:
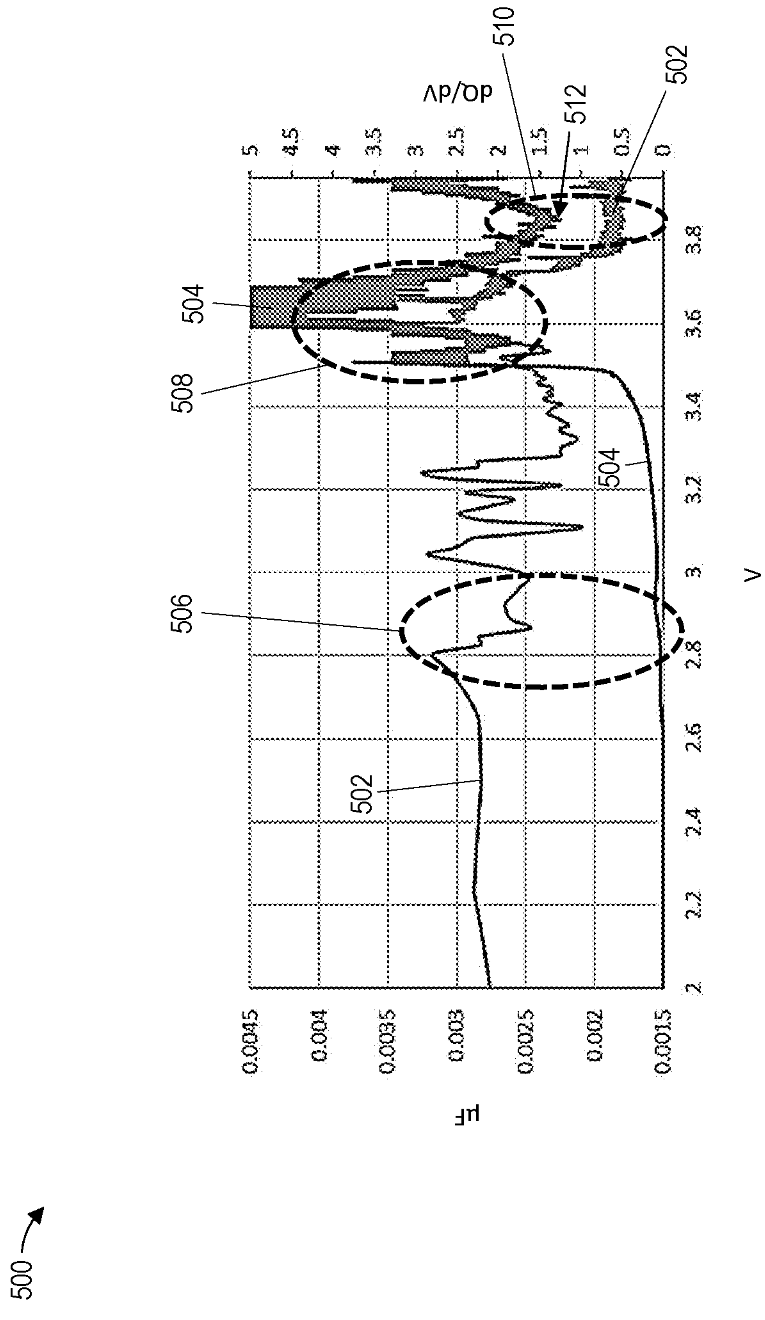
FIG. 5 is an example capacitance-voltage curve over the course of a formation cycling process in accordance with one or more embodiments.

FIG. 5 illustrates an example capacitance-voltage curve 500 over the course of a formation cycling process in accordance with one or more embodiments. As shown in FIG. 5, a series of capacitance measurements 502 (e.g., the measured capacitance C discussed with respect to FIG. 3) have been taken with respect to the cell potential (V) during a formation cycling process. In some embodiments, the formation cycling process depicts a first formation cycling process, although other formation cycles are within the contemplated scope of this disclosure. The capacitance measurements 502 can be taken continuously (as shown) or periodically (not separately indicated) as desired for a given application. Further, the capacitance-voltage curve 500 includes an overlay 504 depicting the differential capacity-voltage cycling ratio dQ/dV according to the measured capacitance C and the respective cell potential. The capacitance-voltage curve 500 shown in FIG. 5 depicts the behavior of an example 5 Ah battery cell along two data streams. Cell capacitance (e.g., capacitance measurements 502) is shown as a function of cell potential and incremental capacity (as in the charge capacity of the cell in Ah) is tracked according to overlay 504 as function of cell potential. It should be understood, however, that the capacitance-voltage curve 500 is merely illustrative and that respective curves will vary depending on the underlying battery configuration, size, and chemistry, electrolyte selection, etc., and all such configurations are within the contemplated scope of this disclosure.

As further shown with respect to FIG. 5, the capacitance-voltage curve 500 can be divided into at least three regions (e.g., a first region 506, a second region 508, and a third region 510). In some embodiments, the first region 506 signifies the completion of a first formation effect. In some embodiments, the first formation effect shows the physical effect of the additives in the battery cell 202 activating during the formation cycling process. In some embodiments, the first formation effect is indicated by a destabilization of the capacitance measurements 502 (observe the sudden drop of capacitance at approximately 2.8 volts of cell potential) while the overlay 504 indicates the first increase in dQ/dV. Thus, the identification of the first region 506 can serve, in some embodiments, as a physical signature of the activation of the additive(s) in the underlying battery cell.

In some embodiments, the second region 508 signifies the completion of a second formation effect. In some embodiments, the second formation effect includes the phase changes in the anode and cathode active materials due to intercalation and depletion of lithium ions, respectively (that is, an indication of when SEI formation has been achieved). In some embodiments, the second formation effect is the first graphite phase transition due to intercalation of lithium ions. In some embodiments, the second formation effect is indicated by a peak and subsequent drop in both the capacitance measurements 502 and the capacitance-voltage cycling ratio dQ/dV (observe that capacitance and dQ/dV reach respective maximums at a cell potential of approximately 3.6 volts and then decrease thereafter). Thus, the identification of the second region 508 can serve, in some embodiments, as a physical signature of a full SEI formation in the underlying battery cell.

In some embodiments, the third region 510 signifies the completion of a third formation effect. In some embodiments, the third formation effect is the completion of the respective formation cycle (e.g., the first formation cycle). In some embodiments, the third formation effect is indicated by a lithiation peak 512 (e.g., observe the local minima of the capacitance-voltage cycling ratio dQ/dV at approximately 3.8-3.9 volts of cell potential) and a stabilization of the capacitance measurements 502 (observe that measured capacitance C becomes stable after approximately 3.8 volts of cell potential). In some embodiments, the third formation effect is indicated by the identification of 2 phase transitions in the graphite, due to lithium intercalation, and 1 or 2 phase transitions in the cathode active materials due to lithium depletion. Observe that capacitance also tracks with phase transitions imposed by the normal operation of the lithium shuttling during a charge. Thus, the identification of the third region 510 can serve, in some embodiments, as a physical signature of the completion of the respective formation cycle of the underlying battery cell.

Figure 6:
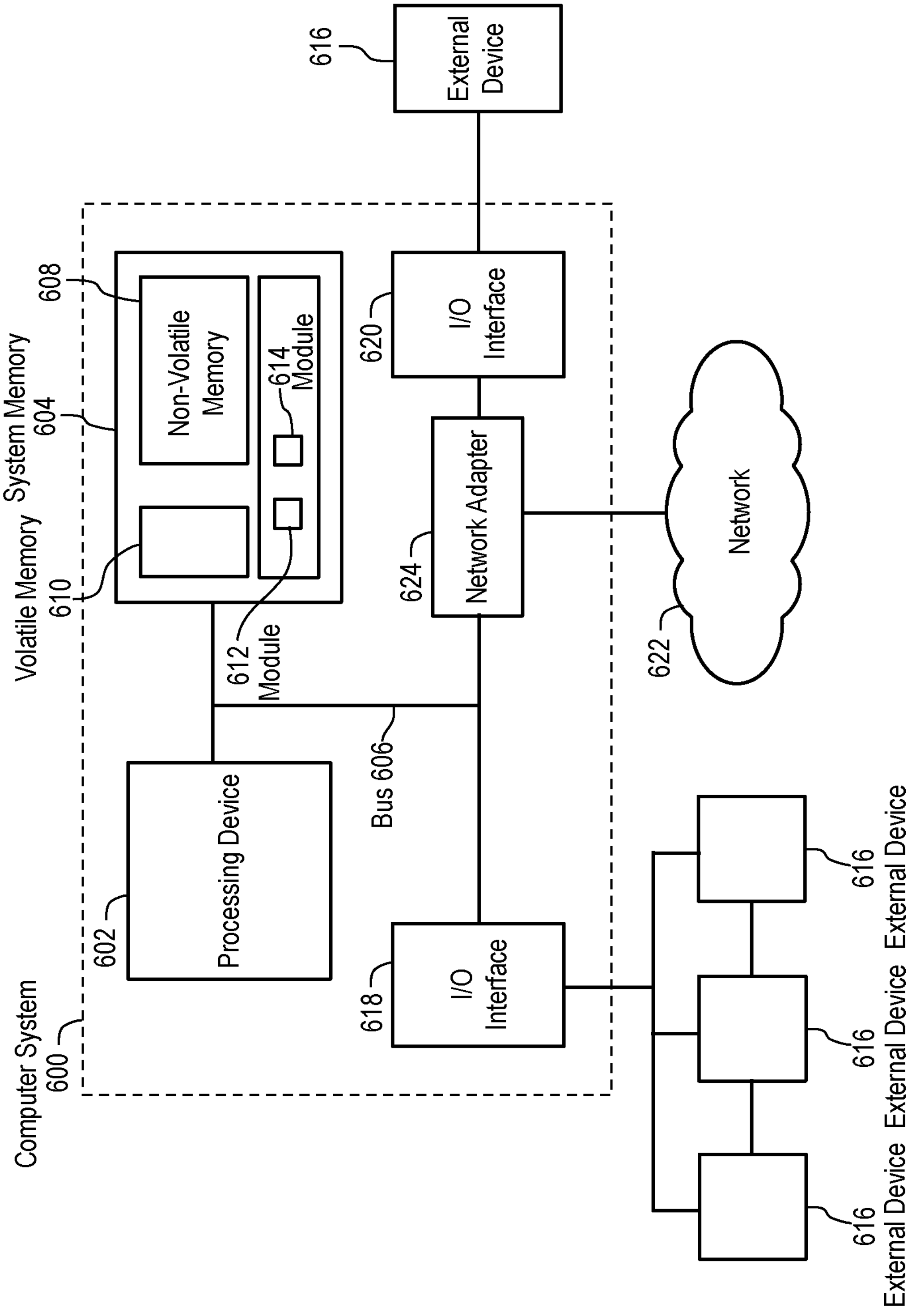
FIG. 6. is a computer system according to one or more embodiments.

FIG. 6 illustrates aspects of an embodiment of a computer system 600 that can perform various aspects of embodiments described herein. In some embodiments, the computer system(s) 600 can implement and/or otherwise be incorporated within or in combination with capacitance measurement system 300 (refer to FIG. 3). For example, in some embodiments, computer system 600 can receive, generate, and/or otherwise process capacitance measurements of a battery cell 202. In another example, in some embodiments, computer system 600 can generate capacitance-time curves (e.g., capacitance-time curve 400 of FIG. 4) and/or capacitance-voltage curves (e.g., capacitance-voltage curve 500 of FIG. 5). In some embodiments, computer system 600 can monitor a capacitance across a battery cell and can identify or otherwise indicate a condition(s) of the respective battery cell. For example, computer system 600 can indicate a transition from a first region 404 to a second region 406 during an electrolyte wetting process. In another example, computer system 600 can indicate one or more formation effects (refer to FIG. 5) during a formation cycle of a battery cell.

Figure 7:
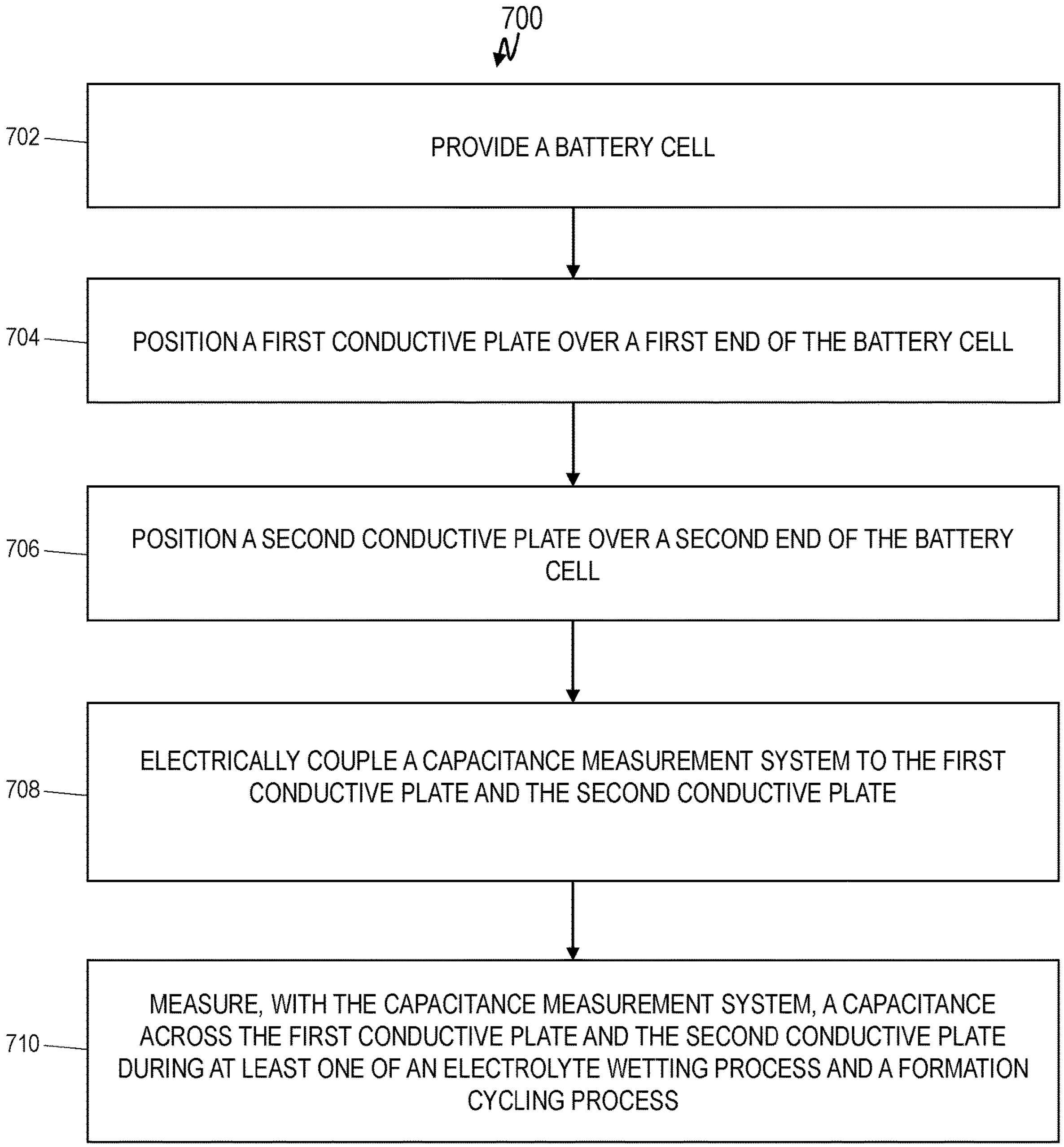
FIG. 7 is a flowchart in accordance with one or more embodiments.

The computer system 600 includes at least one processing device 602, which generally includes one or more processors or processing units for performing a variety of functions, such as, for example, any and/or all of the functions described with respect to FIG. 7. Components of the computer system 600 also include a system memory 604, and a bus 606 that couples various system components including the system memory 604 to the processing device 602. The system memory 604 may include a variety of computer system readable media. Such media can be any available media that is accessible by the processing device 602, and includes both volatile and non-volatile media, and removable and non-removable media. For example, the system memory 604 includes a non-volatile memory 608 such as a hard drive, and may also include a volatile memory 610, such as random access memory (RAM) and/or cache memory. The computer system 600 can further include other removable/non-removable, volatile/non-volatile computer system storage media.

The system memory 604 can include at least one program product having a set (e.g., at least one) of program modules that are configured to carry out functions of the embodiments described herein. For example, the system memory 604 stores various program modules that generally carry out the functions and/or methodologies of embodiments described herein. A module or modules 612, 614 may be included to perform functions related to any of the block diagrams described herein. The computer system 600 is not so limited, as other modules may be included depending on the desired functionality of the computer system 600. As used herein, the term "module" refers to processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality.

The processing device 602 can also be configured to communicate with one or more external devices 616 such as, for example, a keyboard, a pointing device, and/or any devices (e.g., a network card, a modem, etc.) that enable the processing device 602 to communicate with one or more other computing devices. Communication with various devices can occur via Input/Output (I/O) interfaces 618 and 620.

The processing device 602 may also communicate with one or more networks 622 such as a local area network (LAN), a general wide area network (WAN), a bus network and/or a public network (e.g., the Internet) via a network adapter 624. In some embodiments, the network adapter 624 is or includes an optical network adaptor for communication over an optical network. It should be understood that although not shown, other hardware and/or software components may be used in conjunction with the computer system 600. Examples include, but are not limited to, microcode, device drivers, redundant processing units, external disk drive arrays, RAID systems, and data archival storage systems, etc.

Referring now to FIG. 7, a flowchart 700 for leveraging a capacitance measurement system to monitor a capacitance across a battery cell during electrolyte wetting and/or cell formation processes is generally shown according to an embodiment. The flowchart 700 is described in reference to FIGS. 1-6 and may include additional steps not depicted in FIG. 7. Although depicted in a particular order, the blocks depicted in FIG. 7 can be rearranged, subdivided, and/or combined.

At block 702, the method includes providing a battery cell.

At block 704, the method includes positioning a first conductive plate over a first end of the battery cell. In some embodiments, the first conductive plate is separated from the first end of the battery cell by a gap. The gap may be produced and filled with a nonconductive material, including by the casing of the cell itself.

At block 706, the method includes positioning a second conductive plate on a second end of the battery cell. In some embodiments, the second conductive plate is a component of the battery cell. In some embodiments, the second end of the battery cell is opposite the first end of the battery cell.

At block 708, the method includes electrically coupling a capacitance measurement system to the first conductive plate and the second conductive plate.

At block 710, the method includes measuring, with the capacitance measurement system, a capacitance across the first conductive plate and the second conductive plate during at least one of an electrolyte wetting process and a formation cycling process.

In some embodiments, the method includes generating, during an electrolyte wetting process in which a liquid electrolyte is introduced into the battery cell, a capacitance-time curve.

In some embodiments, the method includes identifying, in the capacitance-time curve, a first region dominated by a linearly decreasing capacitance over log time and a second region dominated by a linearly stable capacitance over log time.

In some embodiments, the method includes identifying an improper wetting condition for the battery cell according to an absolute value of a capacitance of the battery cell within the second region.

In some embodiments, the method includes generating, during a formation cycling process for the battery cell, a capacitance-voltage curve.

In some embodiments, the method includes identifying, in the capacitance-voltage curve, a first formation effect includes an activation of an additive in the battery cell during the formation cycling process.

In some embodiments, identifying the first formation effect includes identifying a destabilization of a capacitance measurement with a first increase in an incremental capacity of the battery cell.

In some embodiments, the method includes identifying, in the capacitance-voltage curve, a second formation effect includes phase transitions in the anode and cathode active materials due to intercolation and depletion of lithium ions, respectively.

In some embodiments, identifying the second formation effect includes identifying a peak and subsequent drop in both a capacitance measurement and an incremental capacity of the battery cell due to the phase transitions in the anode and cathode active materials due to intercalation and depletion of lithium ions, respectively.

In some embodiments, the method includes identifying, in the capacitance-voltage curve, a third formation effect includes a completion of the formation cycling process as indicated by completion of several phase transitions in the anode and cathode active materials.

The terms "a" and "an" do not denote a limitation of quantity, but rather denote the presence of at least one of the referenced item. The term "or" means "and/or" unless clearly indicated otherwise by context. Reference throughout the specification to "an aspect", means that a particular element (e.g., feature, structure, step, or characteristic) described in connection with the aspect is included in at least one aspect described herein, and may or may not be present in other aspects. In addition, it is to be understood that the described elements may be combined in any suitable manner in the various aspects.

Additionally, as used in this disclosure, phrases of the form "at least one of an A, a B, or a C," "at least one of A, B, and C," and the like, should be interpreted to select at least one from the group that comprises "A, B, and C." Unless explicitly stated otherwise in connection with a particular instance in this disclosure, this manner of phrasing does not mean "at least one of A, at least one of B, and at least one of C." As used in this disclosure, the example "at least one of an A, a B, or a C," would cover any of the following selections: {A}, {B}, {C}, {A, B}, {A, C}, {B, C}, and {A, B, C}.

When an element such as a layer, film, region, or substrate is referred to as being "on" another element, it can be directly on the other element or intervening elements may also be present. In contrast, when an element is referred to as being "directly on" another element, there are no intervening elements present.

Unless specified to the contrary herein, all test standards are the most recent standard in effect as of the filing date of this application, or, if priority is claimed, the filing date of the earliest priority application in which the test standard appears.

Unless defined otherwise, technical and scientific terms used herein have the same meaning as is commonly understood by one of skill in the art to which this disclosure belongs.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A system for monitoring a capacitance across a battery cell during electrolyte wetting and cell formation, the system comprising:

a battery cell;

a first conductive plate positioned over a first end of the battery cell, the first conductive plate separated from the first end of the battery cell by a gap;

a second conductive plate positioned on a second end of the battery cell, the second conductive plate comprising a component of the battery cell, the second end of the battery cell opposite the first end of the battery cell; and a capacitance measurement system electrically coupled to the first conductive plate and the second conductive plate, the capacitance measurement system configured to:

measure a capacitance across the first conductive plate and the second conductive plate;

generate, during a formation cycling process for the battery cell, a capacitance-voltage curve; and identify, in the capacitance-voltage curve, a first formation effect comprising an activation of an additive in the battery cell during the formation cycling process.

2. The system of claim 1, wherein the capacitance measurement system is further configured to generate, during an electrolyte wetting process in which a liquid electrolyte is introduced into the battery cell, a capacitance-time curve.

3. The system of claim 2, wherein the capacitance measurement system is further configured to identify, in the capacitance-time curve, a first region dominated by a linearly decreasing capacitance over log time and a second region dominated by a linearly stable capacitance over log time.

4. The system of claim 3, wherein the capacitance measurement system is further configured to identify an improper wetting condition for the battery cell according to an absolute value of a capacitance of the battery cell within the second region.

5. The system of claim 1, wherein identifying the first formation effect comprises identifying a destabilization of a capacitance measurement with a first increase in an incremental capacity of the battery cell.

6. The system of claim 1, wherein the capacitance measurement system is further configured to identify, in the capacitance-voltage curve, a second formation effect comprising phase changes in anode and cathode active materials due to intercalation and depletion of lithium ions, respectively.

7. The system of claim 6, wherein identifying the second formation effect comprises identifying a peak and subsequent drop in both a capacitance measurement and an incremental capacity of the battery cell.

8. The system of claim 6, wherein the capacitance measurement system is further configured to identify, in the capacitance-voltage curve, a third formation effect comprising a completion of the formation cycling process as indicated by completion of several phase transitions in the anode and cathode active materials.

9. A method for monitoring a capacitance across a battery cell during electrolyte wetting and cell formation, the method comprising:

providing a battery cell;

positioning a first conductive plate over a first end of the battery cell, the first conductive plate separated from the first end of the battery cell by a gap;

positioning a second conductive plate on a second end of the battery cell, the second conductive plate comprising a component of the battery cell, the second end of the battery cell opposite the first end of the battery cell;

electrically coupling a capacitance measurement system to the first conductive plate and the second conductive plate; and measuring, with the capacitance measurement system, a capacitance across the first conductive plate and the second conductive plate during at least one of an electrolyte wetting process and a formation cycling process;

generating, during a formation cycling process for the battery cell, a capacitance-voltage curve; and identifying, in the capacitance-voltage curve, a first formation effect comprising an activation of an additive in the battery cell during the formation cycling process.

10. The method of claim 9, further comprising generating, during an electrolyte wetting process in which a liquid electrolyte is introduced into the battery cell, a capacitance-time curve.

11. The method of claim 10, further comprising identifying, in the capacitance-time curve, a first region dominated by a linearly decreasing capacitance over log time and a second region dominated by a linearly stable capacitance over log time.

12. The method of claim 11, further comprising identifying an improper wetting condition for the battery cell according to an absolute value of a capacitance of the battery cell within the second region.

13. The method of claim 9, wherein identifying the first formation effect comprises identifying a destabilization of a capacitance measurement with a first increase in an incremental capacity of the battery cell.

14. The method of claim 9, further comprising identifying, in the capacitance-voltage curve, a second formation effect comprising phase changes in anode and cathode active materials due to intercalation and depletion of lithium ions, respectively.

15. The method of claim 14, wherein identifying the second formation effect comprises identifying a peak and subsequent drop in both a capacitance measurement and incremental capacity of the battery cell.

16. The method of claim 14, further comprising identifying, in the capacitance-voltage curve, a third formation effect comprising a completion of the formation cycling process as indicated by completion of several phase transitions in the anode and cathode active materials.

* * * * *